(12) United States Patent
Lee et al.

(10) Patent No.: US 7,525,407 B2
(45) Date of Patent: Apr. 28, 2009

(54) INTEGRATED CIRCUIT HAVING INTEGRATED INDUCTORS

(75) Inventors: Kwang-du Lee, Suwon-si (KR);
Yun-seong Eo, Suwon-si (KR);
Hee-mun Bang, Seoul (KR); Seong-soo Lee, Suwon-si (KR); Sung-jae Jung, Seoul (KR); Heung-bae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 66 days.

(21) Appl. No.: 11/353,966

(22) Filed: Feb. 15, 2006

(65) Prior Publication Data
US 2006/0181386 A1 Aug. 17, 2006

(30) Foreign Application Priority Data
Feb. 15, 2005 (KR) ........................ 10-2005-0012260

(51) Int. Cl.
*H01F 5/00* (2006.01)
(52) U.S. Cl. ....................................................... 336/200
(58) Field of Classification Search .............. 336/65, 336/83, 200, 232; 257/531; 333/181–185
See application file for complete search history.

(56) References Cited

U.S. PATENT DOCUMENTS

| | | | | |
|---|---|---|---|---|
| 4,816,784 A | * | 3/1989 | Rabjohn | ............... 333/24 R |
| 6,707,367 B2 | * | 3/2004 | Castaneda et al. | ............... 336/200 |
| 6,794,977 B2 | * | 9/2004 | Christensen | ............... 336/200 |
| 6,798,326 B2 | * | 9/2004 | Iida | ............... 336/200 |
| 6,867,677 B2 | * | 3/2005 | Nielson | ............... 336/200 |
| 6,972,658 B1 | * | 12/2005 | Findley et al. | ............... 336/200 |
| 7,193,463 B2 | * | 3/2007 | Miyashita et al. | ............... 330/252 |
| 7,202,726 B2 | * | 4/2007 | Kunanayagam et al. | ............... 327/274 |
| 7,215,194 B2 | * | 5/2007 | Kucharski et al. | ............... 330/252 |
| 2004/0217839 A1 | * | 11/2004 | Haaren et al. | ............... 336/200 |
| 2005/0195061 A1 | * | 9/2005 | Terrovitis | ............... 336/200 |

FOREIGN PATENT DOCUMENTS

EP         0 902 533 A1  *  3/1999
KR    10-2001-0058530 A      7/2001

* cited by examiner

*Primary Examiner*—Tuyen T. Nguyen
(74) *Attorney, Agent, or Firm*—Sughrue Mion, PLLC

(57) ABSTRACT

An integrated circuit having integrated inductors includes at least one pair of transistors, and at least one inductor group which includes a pair of inductors coupled to the at least one pair of the transistor, respectively. The pair of the inductors form a spiral shape on a plane and the inductors arranged symmetrically to each other. Magnetic fluxes, which are generated by current flows along the inductors of the at least one inductor group, are formed in a direction to mutually intensify the magnetic fluxes according to differential signals applied to the at least one transistors from outside. Accordingly, high inductance and high quality factor can be attained owing to the positive magnetic coupling of the inductors.

9 Claims, 3 Drawing Sheets

INTEGRATED CIRCUIT HAVING INTEGRATED INDUCTORS

CROSS-REFERENCE TO RELATED APPLICATIONS

This application claims priority from Korean Patent Application No. 2005-12260 filed on Feb. 15, 2005 in the Korean Intellectual Property Office, the entire disclosure of which is incorporated herein by reference.

BACKGROUND OF THE INVENTION

1. Field of the Invention

Apparatuses and methods consistent with the present invention relate to an integrated circuit having integrated inductors, and more particularly to an integrated circuit having integrated inductors that provide high inductance and a high quality factor by laying out the integrated inductors so as to intensify magnetic flux induced by electric currents flowing along the inductors according to applied differential signals.

2. Description of the Related Art

Primarily, an integrated inductor is a crucial passive component for an integrated circuit for the sake of impedance matching, and thus occupies the largest area over the integrated circuit. Since the impedance is a frequency function, the size of the inductors should increase in proportion to the decrease of the operating frequency in order to obtain the same impedance. Disadvantageously, the increasing size of the integrated circuit tends to raise the unit cost of the circuit manufacturing. In this respect, various attempts have been made to develop an integrated inductor small in size and with high inductance and a high quality factor.

FIG. 1 is a side sectional view of a related art integrated circuit having integrated inductors, which is disclosed in U.S. Pat. No. 6,593,201. Referring to FIG. 1, an insulative metal layer 10, which is supported by a substrate 100, receives first inductors 12 and second inductors 14 that are arranged vertically. Hence, not only the size of the integrated circuit can be reduced, but the inductance can be increased as much as the mutual inductance by the magnetic coupling. However, the characteristics of the inductors 14 disposed under the inductors 12 are subject to degradation due to characteristics of the complementary metal oxide semiconductor (CMOS) process, and the quality factor may deteriorate. Additionally, taking account of the configuration alone in which a single signal is applied, the circuit where differential signals are applied requires doubling the size of the inductors.

FIG. 2 is another circuit having integrated inductors, which is disclosed in U.S. Pat. No. 6,549,077. Referring to FIG. 2, a drain inductor 21 is coupled to a drain terminal of a transistor 20, a gate inductor 24 is coupled to a gate terminal of the transistor 20 to apply a RF input signal, and a source inductor 27 is coupled to a source terminal of the transistor 20. With the above configuration, the electric current flows in the same direction to obtain the magnetic coupling so that the direction of the magnetic flux of each inductor 21, 24, and 27 is identical to the current direction. As a result, the inductance can be increased and the size of the integrated circuit can be reduced.

However, disadvantageously, since the transistor 20 is disposed substantially outside the square loop formed by the inductors 21, 24, and 27, the lead line is lengthened and parasitic components may increase. Also, as illustrated in FIG. 1 in which only the configuration with the single signal applied is considered, the circuit with the differential signals applied requires the inductors to be double-sized.

SUMMARY OF THE INVENTION

The present invention has been provided to address the above-mentioned and other problems and disadvantages occurring in the related art, and an aspect of the present invention provides an integrated circuit for providing high inductance and a high quality factor and minimizing the size of the circuit by laying out integrated inductors so as to intensify the magnetic fluxes, which occur by the currents flowing along the inductors, each other according to the applied differential signals.

To achieve the above aspect and/or features of the present invention, an integrated circuit includes at least one pair of transistors; and at least one inductor group which includes a pair of inductors coupled to the at least one pair of the transistor, respectively, the pair of the inductors forming a spiral shape on a plane and the inductors arranged symmetrically to each other. Magnetic fluxes, which are generated by current flows along the inductors of the at least one inductor group, are formed in a direction to mutually intensify the magnetic fluxes according to differential signals applied to the at least one transistors from outside.

The at least one inductor group may include a first inductor; and a second inductor which is arranged symmetrically to the first inductor based on a certain virtual line on the plane.

The first inductor and the second inductor may intersect perpendicularly to each other with a spacing from the certain virtual line on the plane.

The at least one inductor group may include a first inductor group which surrounds the pair of the transistors in a spiral shape; a second inductor group which surrounds the first inductor group at an interval; and a third inductor group which surrounds the second inductor group at an interval.

The at least one pair of the transistors may be arranged in a center of the at least one inductor group.

The at least one inductor group may be at least one of a first inductor group which is coupled to gate terminals of the at last one transistors with one end, a second inductor group which is coupled to source terminals of the at least one transistors with one end, and a third inductor group which is coupled to drain terminals of the at least one transistor with one end.

BRIEF DESCRIPTION OF THE DRAWINGS

These and/or other aspects of the invention will become apparent and more readily appreciated from the following description of exemplary embodiments, taken in conjunction with the accompanying drawing figures of which.

DETAILED DESCRIPTION OF THE EXEMPLARY EMBODIMENTS

Figure 1:
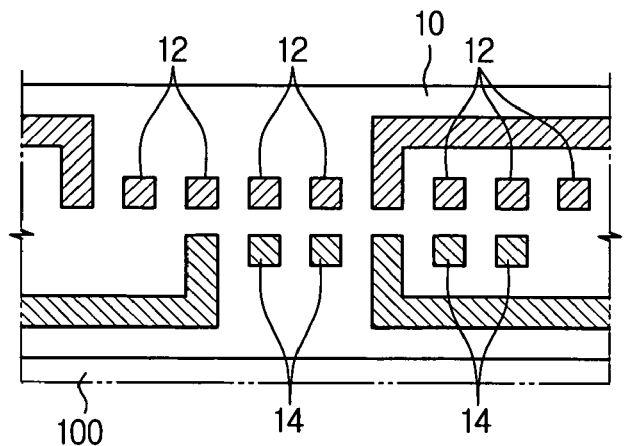
FIG. 1 is a side sectional view of a related art integrated circuit having integrated inductors.
Figure 2:
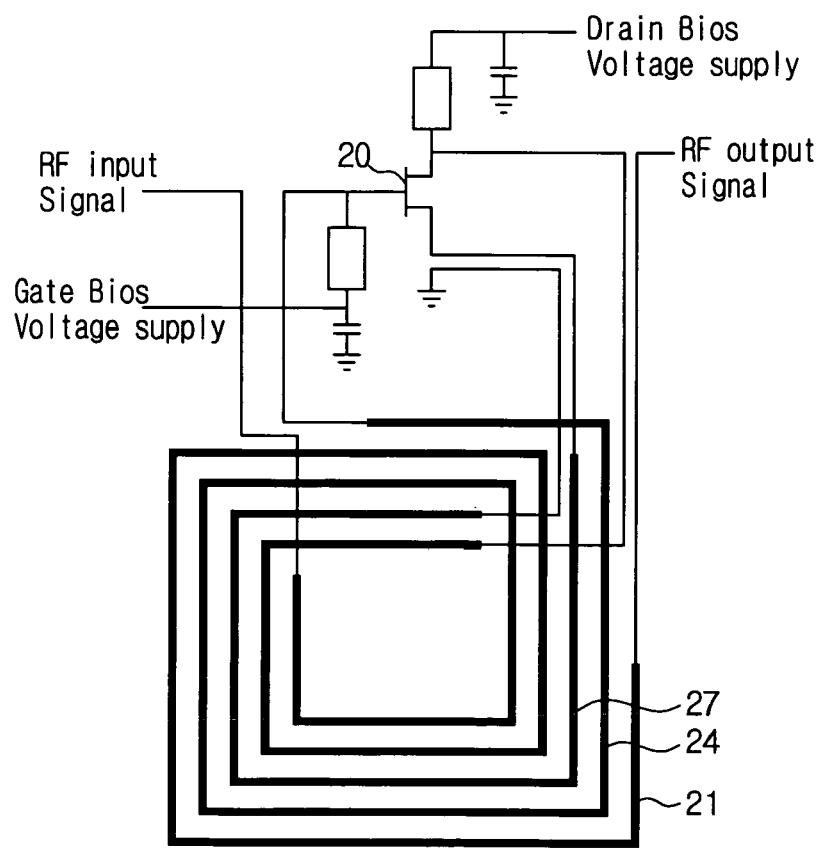
FIG. 2 is a diagram of another related art circuit having integrated inductors.

Certain exemplary embodiments of the present invention will now be described in greater detail with reference to the accompanying drawings.

In the following description, same drawing reference numerals are used for the same elements even in different drawings. The matters defined in the description, such as detailed construction and element descriptions, are provided to assist in a comprehensive understanding of the invention. Also, well-known functions or constructions are not described in detail since they would obscure the invention in unnecessary detail.

Figure 3:
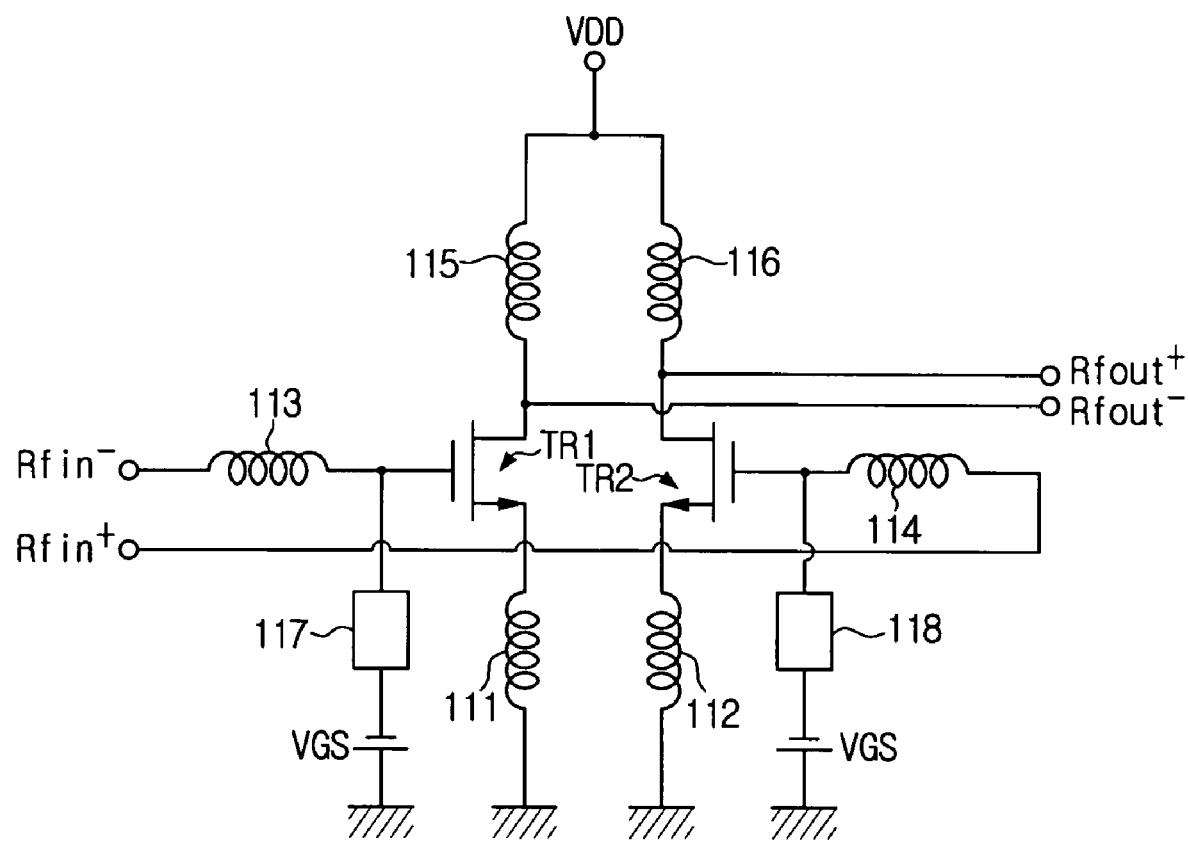
FIG. 3 illustrates a differential circuit that receives and outputs differential signals.

FIG. 3 illustrates an exemplary differential circuit of the invention in which an amplifier or a mixer receives and outputs differential signals. In this case, a high frequency integrated circuit processes the differential signals using a differential pair. This is because the differential signal processing can reject the common mode of a power or a signal as comparing with the single signal processing. Particularly, the differential signal processing is robust to the high frequency that may have greater noise than the signal due to the power fluctuation or harmonic components.

As such, the differential circuit, as shown in FIG. 3, includes a pair of first and second transistors TR1 and TR2, and a plurality of inductors 111 through 116. The plurality of the inductors 111 through 116 is coupled to drain, source, and gate terminals of the transistors TR1 and TR2 for the impedance matching of differential signals that are output from the transistors TR1 and TR2.

The transistors TR1 and TR2 may be implemented as a metal-oxide semiconductor field effect transistor (MOSFET) or a bipolar junction transistor (BJT). In the exemplary embodiment of the present invention, the MOSFET is employed as the transistors TR1 and TR2.

One end of the first inductor 111 is coupled to the source terminal of the first transistor TR1, and the other end is coupled to a ground. The first inductor 111 performs the impedance matching of the source of the first transistor TR1. The second inductor 112 is coupled to the source terminal of the second transistor TR2 with one end and to the ground with the other end. The second inductor 112 performs the impedance matching of the source of the second transistor TR2.

The third inductor 113 receives a radio frequency (RF) input signal Rfin⁻ to one end, and the other end is coupled to the gate terminal of the first transistor TR1. The third inductor 113 performs the impedance matching of the RF input signal Rfin⁻. The fourth inductor 114 receives a RF input signal Rfin⁺ to one end, and the other end is coupled to the gate terminal of the second transistor TR2. The fourth inductor 114 performs the impedance matching of the RF input signal Rfin⁺.

The fifth inductor 115 receives a drain bias voltage VDD to one end, and the other end is connected to the drain terminal of the first transistor TR1 for the impedance matching of a RF output signal Rfout⁻. The sixth inductor 116 receives the drain bias voltage VDD to one end, and the other end is connected to the drain terminal of the second transistor TR2 for the impedance matching of a RF output signal Rfout⁺. RF chokes 117 and 118 are coupled to the gate terminals of the first and second transistors TR1 and TR2, respectively, with one end. The other end of the RF chokes 117 and 118 receives and applies a gate power VGS to the gate terminal of the first and second transistors TR1 and TR2, and prevents the alternating current signal from flowing from the gate power VGS.

Figure 4:
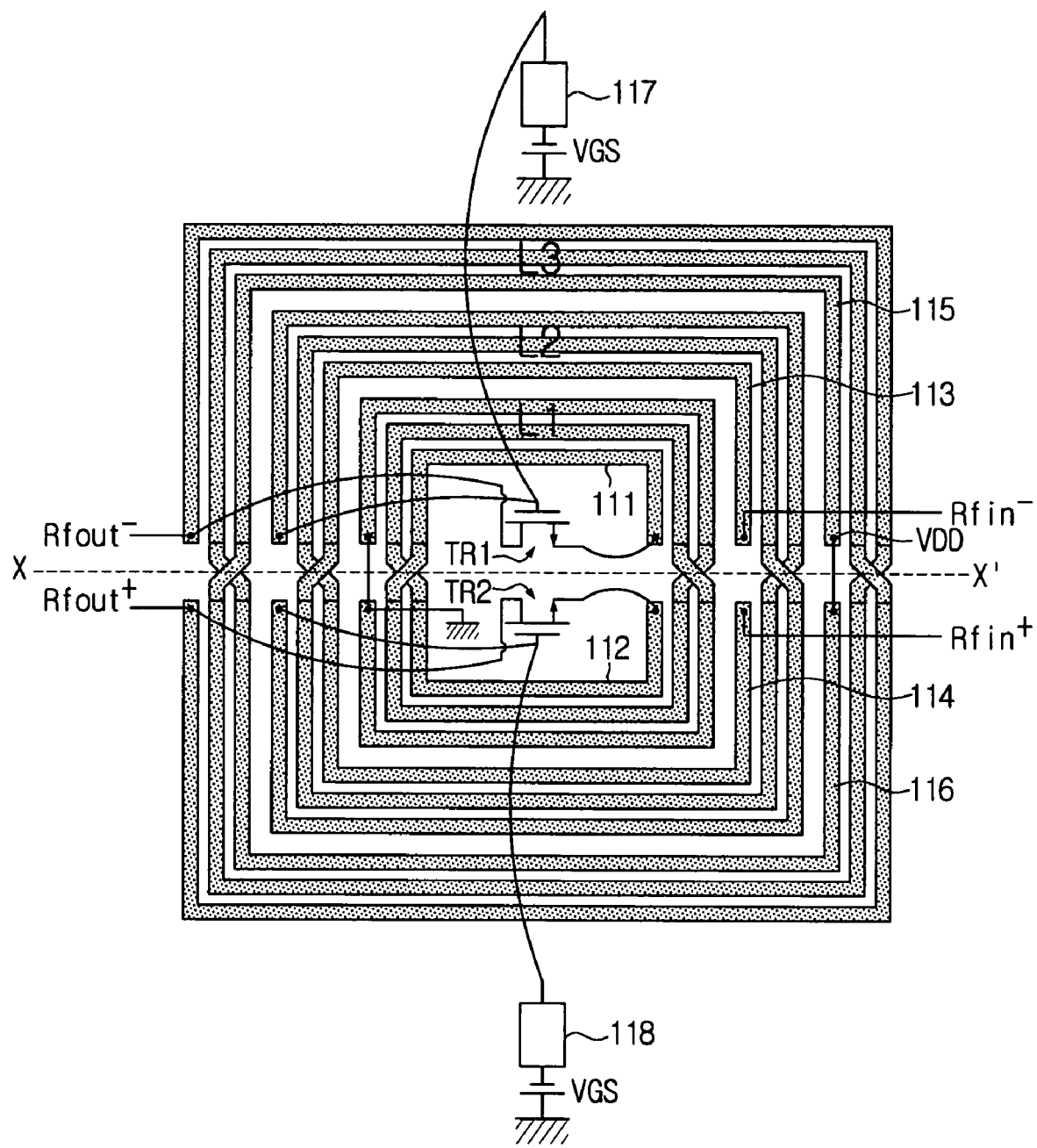
FIG. 4 illustrates inductors adopted to the differential circuit of FIG. 3 according to an exemplary embodiment of the present invention.

FIG. 4 depicts inductors adopted to the differential circuit of FIG. 3 according to an exemplary embodiment of the present invention.

Referring to FIG. 4, first and second transistors TR1 and TR2 are disposed in the center of inductors 111, 112, 113, 114, 115, and 116 that are arranged in a spiral shape.

Thus, it is possible to minimize the length of lead lines that connect terminals of the first and second transistors TR1 and TR2 and the inductors 111 through 116. As a result, parasitic inductance components and parasitic capacitance components due to the lead lines can be minimized.

In the following, the layout of the inductors 111 through 116 is elucidated. The plurality of the inductors 111 through 116 can be grouped into a first inductor group L1, a second inductor group L2, and a third inductor group L3. The first inductor group L1 includes a pair of the inductors 111 and 112 respectively coupled to the source terminal of the transistors TR1 and TR2. The second inductor group L2 includes a pair of the inductors 113 and 114 respectively coupled to the gate terminal of the transistors TR1 and TR2. The third inductor group L3 includes a pair of the inductors 115 and 116 respectively coupled to the drain terminal of the transistors TR1 and TR2. The inductor pairs of the inductor groups L1, L2, and L3 are formed symmetrically in the spiral shape on a plane. The inductor pairs are laid out over the substrate so as to form the magnetic flux, which is generated by the electric current of each inductor, in a direction to intensify the magnetic flux according to the differential signals applied to the transistors TR1 and TR2 from outside.

Specifically, the first inductor 111 forms the square spiral structure having a gradually increasing size in a plane based on the first and second transistors TR1 and TR2. One end of the first inductor 111 is coupled to the source terminal and the other end is coupled to the ground terminal. The second inductor 112 is arranged, substantially, symmetrically to the first inductor 111 with respect to a virtual line X-X'. One end of the second inductor 112 is coupled to the source terminal of the second transistor TR2 and the other end is coupled to the ground terminal for the impedance matching of the source of the second transistor TR2. The first and second inductors 111 and 112 intersect perpendicularly to each other with a spacing from the virtual line X-X' and gradually increase in the size toward the outside.

The third and fourth inductors 113 and 114 surround the first inductor group L1 at an interval. Similarly to the first and second inductors 111 and 112, the third and fourth inductors 113 and 114 form the square spiral structure having a gradually increasing size in the plane based on the first and second transistors TR1 and TR2. Likewise, the third inductor 113 is perpendicular to the fourth inductor 114 with respect to the virtual line X-X'. The third and fourth inductors 113 and 114 intersect perpendicularly to each other with a spacing from the virtual line X-X' and gradually increase in the size toward the outside.

The fifth and sixth inductors 115 and 116 surround the second inductor group L2 at an interval. Similarly to the first and second inductors 111 and 112, the fifth and sixth inductors 115 and 116 form the square spiral structure having a gradually increasing size in the plane based on the first and second transistors TR1 and TR2. The fifth and sixth inductors 115 and 116 intersect perpendicularly to each other with a spacing from the virtual line X-X' and gradually increase in the size toward the outside.

On the right part from the point of view of FIG. 4, the first and second inductors 111 and 112 are coupled to the source terminal of the transistors TR1 and TR2, respectively. The RF input signals Rfin⁻ and Rfin⁺, which are the differential signals, are applied to the third and fourth inductors 113 and 114. The drain bias voltage VDD is supplied to the fifth and sixth inductors 115 and 115, respectively.

On the left part from the point of view of FIG. 4, the first and second inductors 111 and 112 are coupled to the ground terminal, the third and fourth inductors 113 and 114 are coupled to the gate germinal of the transistors TR1 and TR2, and the fifth and sixth inductors 115 an 116 are coupled to the drain terminal and the RF output signal terminals of the transistors TR1 and TR2.

With the layout of the inductors 111 through 116 as shown in FIG. 4, when the differential signals Rfin⁻ and Rfin⁺ are applied in the direction of the current flow from the third inductor 113 to the fourth inductor 114, the current directions along the inductors 111 through 116 are identical in the clockwise direction from the point of view of FIG. 4. Accordingly, the directions of the magnetic flux generated by the current flowing along each inductor 111 through 116 are formed to intensify the magnetic fluxes. That is, the inductors 111 through 116 obtain the positive magnetic coupling. Consequently, the inductance further increases in comparison with the individual inductors 111 through 116. In addition, the quality factor Q of the inductor enhances since it is proportional to the inductance and inversely proportional to the series resistance which incurs losses.

Although the above exemplary embodiment describes the square spiral structure having the inductors 111 through 116 gradually increasing in the size, the present invention is not limited to this shape. It is to be appreciated, for example, that a polygonal shape such as octagon and hexagon, or a circular shape is applicable. Additionally, it is possible to lay out at least one of the inductor groups L1, L2, and L3 over the substrate.

As set forth above, the integrated circuit features higher inductance and a higher quality factor because the inductors are laid out to obtain the magnetic coupling in the direction that mutually intensifies the magnetic fluxes generated by the current flows along the inductors according to the differential signals applied.

Furthermore, the length of the lead lines connecting to the inductors can be minimized by disposing the transistors in the center of the inductors. Therefore, it is possible to minimize parasitic inductance components and parasitic capacitance components occurring due to the lead lines.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An integrated circuit comprising:
   at least one pair of transistors;
   at least one inductor group which includes a pair of inductors coupled to the at least one pair of transistors, respectively, the pair of inductors forming a spiral shape on a plane and the inductors arranged symmetrically to each other; and
   at least one pair of differential signal input terminals which are coupled to the at least one pair of transistors and to which differential signals are applied from the outside,
   wherein magnetic fluxes, which are generated by current flows along the inductors of the at least one inductor group, are formed in a direction to mutually intensify the magnetic fluxes according to the differential signals applied to the at least one pair of transistors via the at least one pair of differential signal input terminals, and
   wherein the at least one inductor group is at least one of a first inductor group which is coupled to gate terminals of the at last one pair of transistors with one end, a second inductor group which is coupled to source terminals of the at least one pair of transistors with one end, and a third inductor group which is coupled to drain terminals of the at least one pair of transistor with one end.

2. The integrated circuit of claim 1, wherein the at least one inductor group comprises:
   a first inductor; and
   a second inductor which is arranged symmetrically to the first inductor based on a certain virtual line on the plane.

3. The integrated circuit of claim 2, wherein the first inductor and the second inductor intersect perpendicularly to each other with a spacing from the certain virtual line on the plane.

4. An integrated circuit comprising:
   at least one pair of transistors;
   at least one inductor group which includes a pair of inductors coupled to the at least one pair of transistors, respectively, the pair of inductors forming a spiral shape on a plane and the inductors arranged symmetrically to each other; and
   at least one pair of differential signal input terminals which are coupled to the at least one pair of transistors and to which differential signals are applied from the outside,
   wherein magnetic fluxes, which are generated by current flows along the inductors of the at least one inductor group, are formed in a direction to mutually intensify the magnetic fluxes according to the differential signals applied to the at least one pair of transistors via the at least one pair of differential signal input terminals, and
   wherein the at least one inductor group comprises:
   a first inductor group which surrounds the pair of the transistors in a spiral shape;
   a second inductor group which surrounds the first inductor group at an interval; and
   a third inductor group which surrounds the second inductor group at an interval.

5. The integrated circuit of claim 1, wherein the at least one pair of transistors is arranged in a center of the at least one inductor group.

6. The integrated circuit of claim 1, wherein the symmetry between the pair of inductors is a mirror symmetry.

7. The integrated circuit of claim 1, wherein the at least one inductor group is coupled to the at least one group of transistors on one end and coupled to the at least one pair of differential signal input terminals on the other end.

8. The integrated circuit of claim 1, further comprising a pair of differential signal output terminals coupled to the at least one pair of transistors.

9. An integrated circuit comprising:
   at least one pair of transistors;
   at least one inductor group which includes a pair of inductors coupled to the at least one pair of transistors, respectively, the pair of inductors forming a spiral shape on a plane and the inductors arranged symmetrically to each other; and
   means for controlling the direction of current flow along the at least one inductor group so as to mutually intensify magnetic fluxes generated by the current according to differential signals applied to the at least one pair of transistors from outside,
   wherein the at least one inductor group is at least one of a first inductor group which is coupled to gate terminals of the at last one pair of transistors with one end, a second inductor group which is coupled to source terminals of the at least one pair of transistors with one end, and a third inductor group which is coupled to drain terminals of the at least one pair of transistor with one end.

* * * * *